United States Patent
Rasmus et al.

(10) Patent No.: US 10,326,417 B1
(45) Date of Patent: Jun. 18, 2019

(54) OFFSET NULLING FOR HIGH-SPEED SENSE AMPLIFIER

(71) Applicant: QUALCOMM Incorporated, San Diego, CA (US)

(72) Inventors: Todd Morgan Rasmus, Cary, NC (US); Minhan Chen, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/829,774

(22) Filed: Dec. 1, 2017

(51) Int. Cl.
*H03F 3/45* (2006.01)

(52) U.S. Cl.
CPC ... *H03F 3/45179* (2013.01); *H03F 2200/375* (2013.01); *H03F 2203/45042* (2013.01)

(58) Field of Classification Search
CPC .......... H03F 3/45179; H03F 2200/375; H03F 2203/45042; H03F 3/45; H03F 3/45183; H03F 3/45188; H03F 3/45192; H03F 2200/177
USPC ........................................................ 330/253
See application file for complete search history.

(56) References Cited

U.S. PATENT DOCUMENTS

| | | |
|---|---|---|
| 4,558,240 A | 12/1985 | Stewart |
| 4,833,406 A | 5/1989 | Foster |
| 5,568,438 A | 10/1996 | Penchuk |
| 7,368,968 B1 | 5/2008 | Lai et al. |
| 7,541,857 B1 | 6/2009 | Wong et al. |
| 7,825,714 B1 | 11/2010 | Groe et al. |
| 8,232,848 B2 * | 7/2012 | Kato .................. H03F 3/45183 331/183 |
| 8,610,465 B2 * | 12/2013 | Jansson ............... H03F 3/45753 330/9 |
| 2001/0050552 A1 | 12/2001 | Sandquist et al. |
| 2010/0231305 A1* | 9/2010 | Mizokami ............... H03F 1/301 330/310 |
| 2013/0214865 A1 | 8/2013 | Bulzacchelli et al. |

OTHER PUBLICATIONS

International Search Report and Written Opinion—PCT/US2018/059528—ISA/EPO—dated Feb. 12, 2019.

* cited by examiner

*Primary Examiner* — Khanh V Nguyen
(74) *Attorney, Agent, or Firm* — Haynes and Boone, LLP (36340)

(57) ABSTRACT

A resistor in a pair of resistors is selectively coupled to a current source through a selection switch during the reset phase of a voltage-mode sense amplifier so that one evaluation node for the voltage-mode sense amplifier is discharged from a power supply voltage by an ohmic voltage drop across the selectively-coupled resistor to null an offset for the voltage-mode sense amplifier.

20 Claims, 3 Drawing Sheets

OFFSET NULLING FOR HIGH-SPEED SENSE AMPLIFIER

TECHNICAL FIELD

This application relates to sense amplifiers, and more particularly to high-speed sense amplifiers with offset nulling.

BACKGROUND

Voltage-mode sense amplifiers include a pair of cross-coupled inverters to form a latch. The regenerative feedback in the latch provides advantageous speed with regard to sensing high-data-rate input data. Voltage-mode sense amplifiers are thus commonly used in a wide range of data transmission applications. To respond to a differential data input signal, a voltage-mode sense amplifier includes a differential pair of transistors whose gates are driven by the differential data input signal. Depending upon the binary state of the differential data input signal, one of the drain terminals for the differential pair of transistors will slew faster towards ground than the other. The drain terminals couple to the inputs for the cross-coupled pair of inverters. The positive feedback through the cross-coupling of the inverters causes one of the inverter outputs to quickly charge to the power supply voltage whereas the other inverter output is discharged.

Although a voltage-mode sense amplifier is capable of advantageous speed with regard to evaluating the differential data input signal, a differential pair of transistors can never be manufactured to be perfectly matched to each other. The latch has a similar imbalance. The resulting circuit imbalances effectively creates a voltage offset with regard to the response of the differential pair of transistors even if there is no differential input voltage across the gates of the differential pair of transistors. In other words, even with the differential input voltage being zero, it is as if the offset voltage is impressed across the gates of the differential pair of transistors such that the voltage-mode sense amplifier favors one binary output state over the other. This offset voltage can be as much as 20 mV or even 50 mV or higher. Such a level of offset voltage is problematic because the differential input voltage tends to drop as the data rates are pushed ever higher—for example, a voltage-mode sense amplifier may have to make a bit decision based upon a differential data input signal having an amplitude swing of as little as 10 mV. The presence of a 20 mV offset voltage would thus thwart the sensing of such a differential input voltage.

It is thus conventional to null the offset voltage for a voltage-mode sense amplifier. For example, it is known to incrementally switch on additional transistors to boost the weaker transistor in the differential pair. These additional transistors connect between the drain and source of the boosted transistor and are switched on regardless of the binary state for the input data signal. Alternatively, an additional differential pair may be coupled in parallel with the original differential pair of transistors. A voltage DAC biases the gates of the additional differential pair of transistors in a technique denoted as a two-port differential adjustment.

Although these existing offset calibration techniques null the offset voltage, the drain terminals of the differential pair are then saddled with parasitic capacitance. This parasitic capacitance slows down the slew rate for the drain terminals, which is problematic for high-speed data evaluation.

Accordingly, there is a need in the art for improved offset nulling for high-speed sense amplifiers.

SUMMARY

To null the offset for a voltage-mode sense amplifier, one evaluation node from a pair of evaluation nodes is charged to a power supply voltage during a reset phase. A remaining evaluation node from the pair of evaluation nodes is charged to the power supply voltage minus a ohmic voltage drop produced by a current sourced through a resistor. The voltage-mode sense amplifier includes a differential pair of transistors that discharge one of the evaluation nodes more than the other evaluation node during an evaluation phase responsive to a binary value for a differential data input signal. The voltage-mode sense amplifier also includes a latch having a pair of cross-coupled inverters that respond to a voltage difference between the discharged evaluation mode and the remaining less-discharged evaluation node by latching a data output signal. A current source such as a current digital-to-analog (DAC) sources the current sourced through the resistor according to a level set during a calibration phase.

In the calibration phase, the differential data input signal is shorted such that there is no differential voltage across the gates for the pair of differential transistors. The voltage-mode sense amplifier should then be in equipoise such that the latching of a binary one value is neither favored nor disfavored with regard to the latching of a binary zero value for the data output signal. But due to the offset within the voltage-mode sense amplifier, one binary value will be favored over the other. The current from the current source is then varied with respect to lowering the charged voltage for a selected one of the evaluation nodes to minimize or greatly reduce the offset such that neither a binary one nor a binary zero value for the data output signal is favored by the voltage-mode sense amplifier. The resulting nulling of the offset is quite advantageous with respect to high-speed operation because the ohmic voltage drop from the power supply voltage for the selected one of the evaluation nodes during the reset phase does not involve any significant capacitive loading of the evaluation nodes. The slew rate for the discharge of the evaluation node during the evaluation phase is thus not hampered by such a missing capacitive load, which improves the high-speed operation of the voltage-mode sense amplifier.

These and other advantageous features may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

Figure 1:
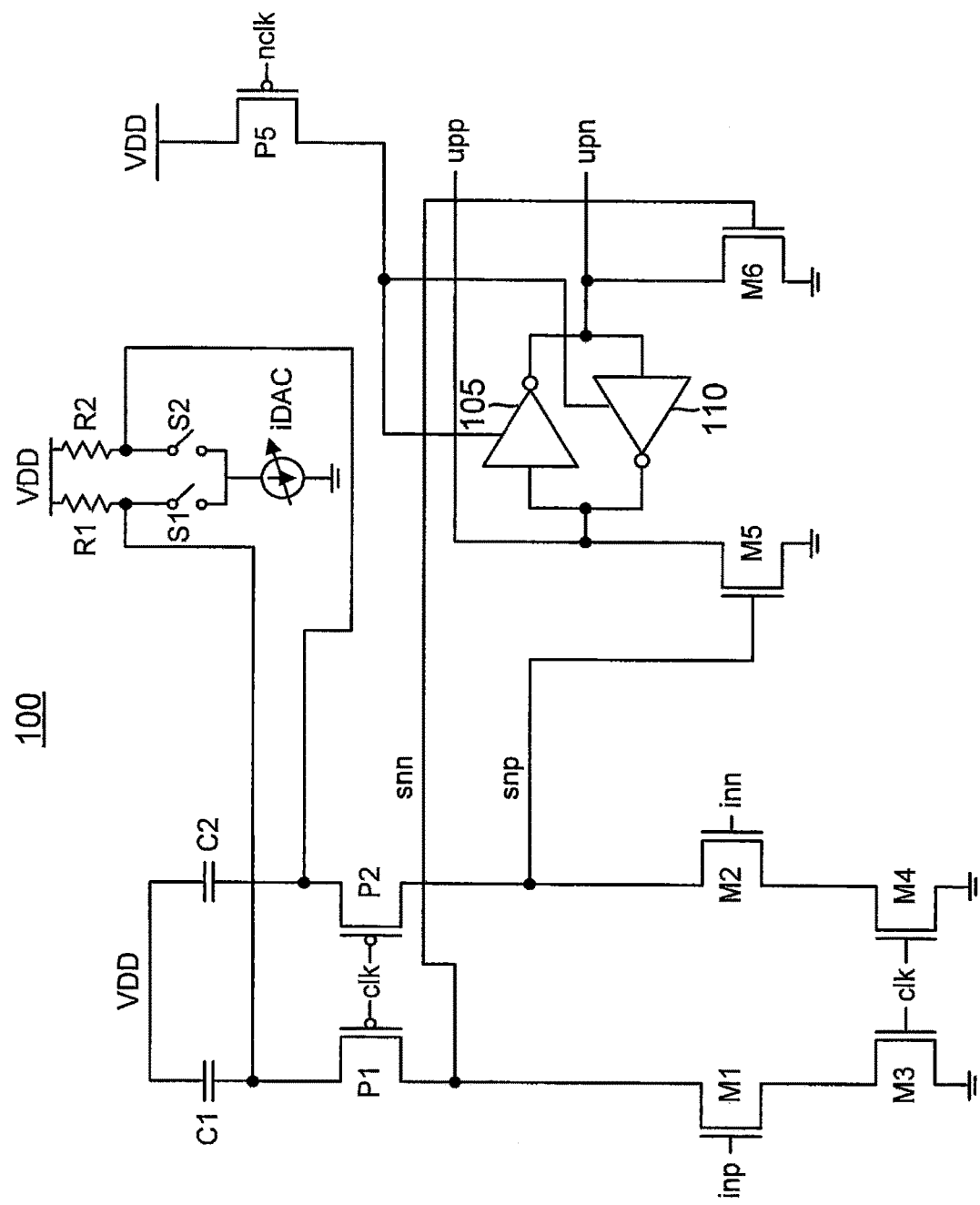
FIG. 1 is a circuit diagram of a voltage-mode sense amplifier in which one evaluation node from a pair of evaluation nodes is charged to the power supply voltage during a reset phase while a remaining one of the evaluation nodes is charged to the power supply voltage minus a ohmic voltage drop resulting from a current sourced through a resistor coupled between the remaining one of the evaluation nodes and a power supply voltage node in accordance with an aspect of the disclosure.

A voltage-mode sense amplifier is provided in which the nulling of the offset does not significantly affect the slew rate for the discharge of the evaluation nodes. In particular, the voltage-mode sense amplifier includes a pair of differential transistors in which the gates of the differential pair transistors are driven by a differential data input signal. Depending upon the binary value for the differential data input signal during an evaluation phase, the differential pair of transistors will discharge one of the evaluation nodes more than the other. The slew rate for this discharge should not be hampered by any capacitive loading from the offset nulling. To minimize or reduce this capacitive loading, the evaluation nodes are not equally charged to the power supply voltage during a reset phase. Instead, only one of the evaluation nodes is charged to the power supply voltage. During the reset phase, each evaluation node couples through a respective resistor to the power supply voltage node carrying the power supply voltage. Should there be no current through the evaluation node's resistor, there is thus no ohmic voltage drop across it. But each resistor couples through a selection switch to a variable current source such as a current DAC. Depending upon which resistor is selected by the selection switch, an ohmic voltage drop will result across the selected resistor as given by a product of the resistor's resistance and the current source current. The corresponding evaluation node will thus be charged to the power supply voltage minus the ohmic voltage drop across its corresponding resistor during the evaluation phase.

The selection by the selection switch for a resistor thus also selects one of the evaluation nodes for the ohmic voltage drop. In the subsequent evaluation phase, the evaluation node with the ohmic voltage drop will have a "head-start" with regard to its discharge as compared to the remaining evaluation node. This discharge substantially corrects for the offset within the voltage-mode sense amplifier such that neither a binary one nor a binary zero outcome is favored. A latch within the voltage-mode sense amplifier responds to the voltage difference across the evaluation nodes resulting from the discharge produced by the differential pair of transistors during the evaluation phase to latch a binary value for a data output signal.

The level for the current source current is determined during a calibration phase in which the differential input voltage is shorted such that the voltage-mode sense amplifier should neither favor a latching of a binary one nor a latching of a binary zero with regard to the data output signal. But due to its offset, the voltage-mode sense amplifier will favor either the binary one value or the binary zero value prior to the offset nulling. The amount of current source current from the current source is thus varied as applied to the appropriate resistor through a corresponding setting of the selection switch until the voltage-mode sense amplifier no longer favors a binary outcome (or at least until such a favoring is minimized within the resolution of the current source's control over its current source current). The resulting offset nulling is quite advantageous as there is substantially little or no capacitive loading of the evaluation nodes such that the slew rate for their discharge is not lowered. High-speed operation for the voltage-mode sense amplifier is thus enhanced.

An example voltage-mode sense amplifier 100 is shown in FIG. 1. An n-type metal oxide semiconductor (NMOS) transistor M1 and an NMOS transistor M2 form the differential pair of transistors that respond to a differential data input signal applied to their gates. In particular, a positive-half data input signal inp drives the gate of transistor M1 whereas a negative-half data input signal inn drives the gate of transistor M2. It will be appreciated that a p-type metal oxide semiconductor (PMOS) differential pair of transistors may be used in alternative implementations.

The sources of transistors M1 and M2 couple to ground through an NMOS switch transistor M3 and an NMOS switch transistor M4. In particular, a clock signal (clk) drives the gates of switch transistors M3 and M4 such that the sources of transistors M1 and M2 couple to ground when the clock signal is asserted to the power supply voltage during an evaluation phase. A reset phase occurs when the clock signal is discharged such that the sources of transistors M1 and M2 float. The drain of transistor M1 couples to the power supply node for the power supply voltage VDD though a PMOS switch transistor P1 and a resistor R2. Similarly, the drain of transistor M2 couples to the power supply node through a PMOS switch transistor P2 and a resistor R1. To provide filtering, resistor R1 is coupled in parallel with a capacitor C2. Similarly, resistor R2 is coupled in parallel with a capacitor C1. The clock signal drives the gates of switch transistors P1 and P2 so that these transistors are switched on during the reset phase when the clock signal is low. Conversely, switch transistors P1 and P2 are switched off when the clock is high.

The drains of transistors M1 and M2 form the evaluation nodes. In particular, the drain of transistor M1 forms a first evaluation node snn whereas the drain of transistor M2 forms a second evaluation node snp. In alternative implementations, the gate of differential pair transistor M1 may couple to the evaluation node snp through a capacitor (not shown in FIG. 1) whereas the gate of differential pair transistor M2 may couple to the evaluation node snn through another capacitor (also not shown in FIG. 1) to address differential kickback due to the Miller effect for the differential pair. The evaluation nodes snp and snn drive a latch formed by a cross-coupled pair of inverters 105 and 110. In particular, the evaluation node snp connects to the gate of an NMOS transistor M5 having a source tied to ground and a drain connected to the input of inverter 105. Similarly, the evaluation node snn connects to the gate of an NMOS transistor M6 having its source tied to ground and a drain tied to the input of inverter 110. The output of inverter 110 drives the positive half upp of the data output signal whereas the output of inverter 105 drives the negative half upn of the data output signal. During the evaluation phase, the regenerative feedback resulting from the cross coupling of inverters 105 and 110 will result in one of output signals upp and upn being charged to the power supply voltage whereas a remaining one of the output signals will be discharged to ground. The binary state of the output signals upp and upn defines the binary state of the data output signal for voltage-mode sense amplifier 100.

During the reset phase, both the evaluation nodes snn and snp are charged sufficiently high such that transistors M5 and M6 are both switched on to discharge the output signals upp and upn. To prevent inverters 105 and 110 from fighting such a discharge, the power supply input nodes for these inverters couple to the power supply node for the power supply voltage VDD through a PMOS switch transistor P5. In alternative implementations, each inverter may have its own PMOS switch transistor for coupling to the power supply node. An inverted form of the clock signal (nclk) drives the gate of switch transistor P5 to cut off the power supply to inverters 105 and 110 during the reset phase. In a conventional voltage-mode sense amplifier, both the evaluation nodes would be charged to the power supply voltage during the reset phase when the clock signal is low. But only one of the evaluation nodes in voltage-mode sense amplifier 100 is charged to the power supply voltage during the reset phase. A remaining one of the evaluation nodes is partially discharged from the power supply voltage to null the offset for voltage-mode sense amplifier. To perform this discharge, the source of switch transistor P1 couples through resistor R2 to the power supply voltage node. In particular, resistor R2 has a first terminal tied to the power supply voltage node and a second terminal tied to the source of switch transistor P1. The evaluation node snn will thus be coupled to the second terminal for the resistor R2 during the reset phase. Similarly, resistor R1 has a first terminal tied to the power supply node and a second terminal tied to the source of switch transistor P2. The evaluation node snp will thus be coupled to the second terminal of resistor R1 during the reset phase. Should there be no current through either resistor R1 or R2, there is no ohmic voltage drop across them such the evaluation nodes snn and snp would both be charged to the power supply voltage during the reset phase. But a selection though a selection switch formed by a pair of switches S1 and S2 forces either resistor R1 or resistor R2 to conduct a current source current such as sourced by a current DAC (iDAC). Switches S1 and S2 are exclusive such that only one of them is closed during operation. For example, suppose switch S1 is closed and switch S2 opened. The current source current then flows through resistor R1 to produce an ohmic voltage drop equaling the product of the current source current and the resistance of resistor R1 (which would typically be matched to the resistance of resistor R2). Evaluation node snp (through switch transistor P2) is then charged to the power supply voltage VDD minus the ohmic voltage drop during the reset phase. As discussed above, the differential pair transistors M1 and M2 respond to the differential data input signal by discharging one of the evaluation modes faster than the other during the evaluation phase. Should the offset within voltage-mode sense amplifier 100 favor the discharge of evaluation node snn over node snp, the ohmic voltage drop for node snp then nulls this offset. A similar nulling would occur if the offset favored the discharge of evaluation node snp—in that case, switch S2 would be closed and switch S1 opened such that evaluation node snn would be charged to the power supply voltage VDD minus the ohmic voltage drop. Note that if capacitors C1 and C2 were absent, the recharging of the evaluation nodes would be delayed by the RC time constant resulting from the resistance R1 (or R2) multiplied by the evaluation node parasitic capacitance. Capacitors C1 and C2 thus permit rapid recharging of the evaluation nodes without such an RC time constant delay. The resulting nulling of the offset by the action of switches S1, S2, resistor R1, resistor R2, and the iDAC is quite advantageous as there is relatively little capacitive loading of the evaluation nodes. The evaluation nodes may thus have a relatively fast slew rate during the evaluation phase, which benefits high-speed operation.

Figure 2:
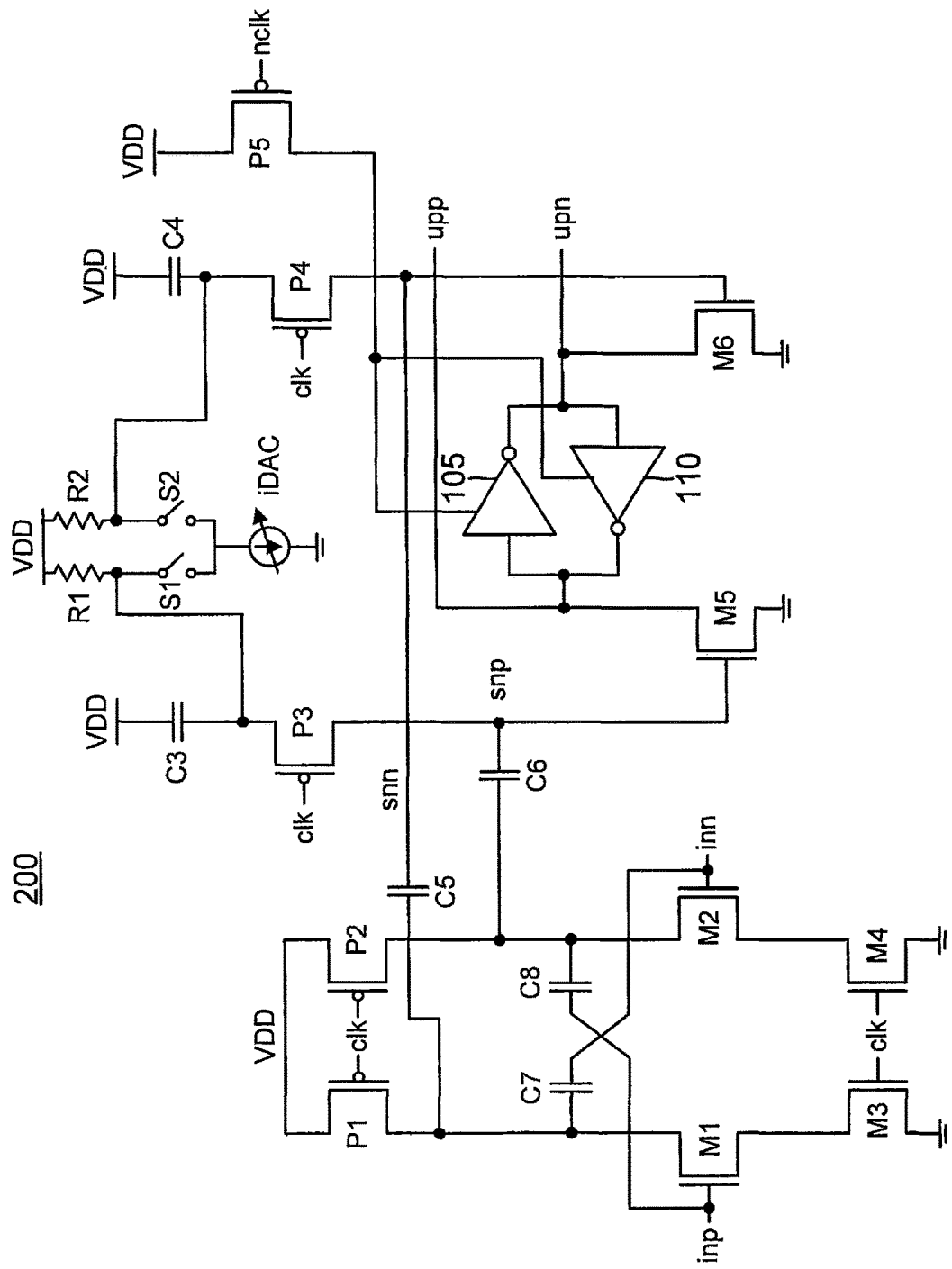
FIG. 2 is a circuit diagram of a voltage-mode sense amplifier that, in contrast to sense amplifier of FIG. 1, is modified to prevent the voltage drop of the remaining one of the evaluation nodes from affecting the charging of the drain terminals for a differential pair of transistors in the voltage-mode sense amplifier in accordance with an aspect of the disclosure.

During normal operation, voltage-mode sense amplifier 100 evaluates the differential data input signal every clock cycle in a corresponding reset phase and a corresponding evaluation phase. Prior to this normal operation, the level for the current source current from the iDAC is calibrated in a calibration phase as discussed above. Although the resulting nulling is quite advantageous, note that drains of the differential pair transistors M1 and M2 are not charged equally to the power supply voltage during the reset phase due to the ohmic voltage drop for one of these nodes. Such unequal charging may couple through the Miller capacitance of the differential pair transistors so as to inject charge (or kickback) into the data source (not illustrated) driving the differential data input signal to voltage-mode sense amplifier 100 even if cross-coupled capacitors are used to address this Miller effect capacitance. A voltage-mode sense amplifier 200 shown in FIG. 2 addresses this potential charge injection by isolating the drain of differential pair transistor M1 from evaluation node snn through a capacitor C5. Similarly, a capacitor C6 couples between the drain of differential pair transistor M2 and evaluation node snp. The isolation provided by capacitors C5 and C6 allows the drains of the differential pair of transistors M1 and M2 to be charged to the power supply voltage VDD during the reset phase despite the partial discharge of one of the evaluation nodes. In particular, the drain of differential pair transistor M1 connects to the power supply node through switch transistor P1 whereas the drain of differential pair transistor M2 connects to the power supply node through switch transistor P2. As discussed with regard to FIG. 1, the gates of switch transistors P1 and P2 are driven by the clock signal clk so that the drains for the differential pair transistors are charged to the power supply voltage VDD during the reset phase.

Evaluation node snn couples to the power supply node through a PMOS switch transistor P4 and resistor R2. The clock signal clk drives the gate of switch transistor P4 so that evaluation node snn is charged during the reset phase. Similarly, evaluation node snp couples to the power supply node through a PMOS switch transistor P3 driven by the clock signal clk and resistor R1. A capacitor C3 couples in parallel with resistor R1 to provide filtering. Similarly, a capacitor C4 couples in parallel with resistor R2. To provide the selective ohmic voltage drop to evaluation node snp, resistor R1 may selectively couple through switch S1 to the source of switch transistor P3. Similarly, resistor R2 may couple through switch S2 to the source of switch transistor P4 to provide an ohmic voltage drop to evaluation node snn. Depending upon which switch S2 or S2 is closed, the current source current from the iDAC will produce the ohmic voltage drop across the corresponding resistor such that the corresponding evaluation node is charged to the power supply voltage VDD minus the ohmic voltage drop during the reset phase. To reduce the Miller effect capacitance for the differential pair transistors M1 and M2, the gate of differential pair transistor M1 couples to the drain of differential pair transistor M2 through a capacitor C8. Similarly, the gate of differential pair transistor M2 couples to the drain of differential pair transistor M1 through a capacitor C7. It will be appreciated that an analogous pair of cross-coupled capacitors may be used in voltage-mode sense amplifier 100 to reduce differential kickback due to the Miller effect capacitance.

In one implementation, the pair of resistors R1 and R2, the selection switches S1 and S2, and the iDAC may be deemed to form a means for charging a first one of the evaluation nodes snp and snn to a power supply voltage during the reset phase and to charge a remaining one of the evaluation nodes snp and snn to the power supply voltage minus an ohmic voltage drop during the reset phase.

Figure 3:
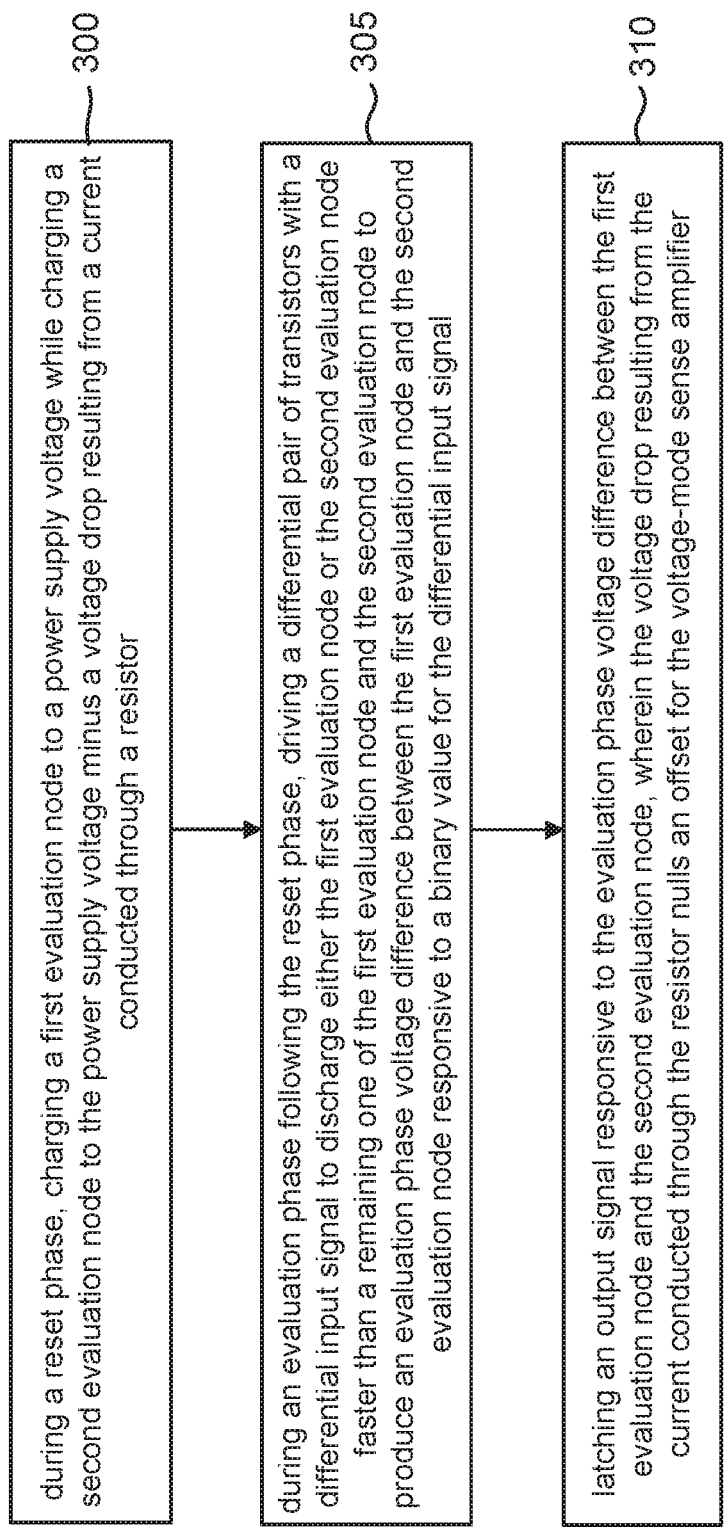
FIG. 3 is a flowchart for a method of operation for a voltage-mode sense amplifier in accordance with an aspect of the disclosure.

An example method of operation for nulling the offset in a voltage-mode sense amplifier will now be discussed with reference to the flowchart of FIG. 3. The method includes an act 300 of, during a reset phase, charging a first evaluation node to a power supply voltage while charging a second evaluation node to the power supply voltage minus an ohmic voltage drop resulting from a current conducted through a resistor. The charging of evaluation nodes snn and snp in voltage-mode sense amplifiers 100 or 200 during the reset phase is an example of act 300. The method also includes an act 305 of, during an evaluation phase following the reset phase, driving a differential pair of transistors with a differential input signal to discharge either the first evaluation node or the second evaluation node more than a remaining one of the first evaluation node and the second evaluation node to produce an evaluation phase voltage difference between the first evaluation node and the second evaluation node responsive to a binary value for the differential input signal. With regard to the differential data input signal, it is conventional in high-speed operation that the voltage difference between the positive-half data input signal inp and the negative-half data input signal inn is as low as 10 mV. But the common mode for the differential data input signal will be positive such that both signals cause their respective differential pair transistors to discharge the corresponding evaluation node. So both evaluation nodes will slew towards ground during the evaluation phase. But one of them will slew faster, which produces the evaluation phase voltage difference of act 305.

Finally, the method includes an act 310 of latching an output signal responsive to a voltage difference between the first evaluation node and the second evaluation node, wherein the ohmic voltage drop resulting from the current conducted through the resistor nulls an offset for the voltage-mode sense amplifier. The latching of the data output signal by cross-coupled inverters 105 and 110 is an example of act 310.

It will thus be appreciated that many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

We claim:

1. A voltage-mode sense amplifier, comprising:
   a differential pair of transistors;
   a pair of evaluation nodes, wherein the differential pair of transistors are configured to discharge, during an evaluation phase, one of the evaluation nodes faster than a remaining one of the evaluation nodes responsive to a binary value for a differential input signal;
   a current source;
   a pair of resistors corresponding to the pair of evaluation nodes on a one-to-one basis, wherein each resistor has a first terminal coupled to a power supply node and has a second terminal coupled to the corresponding evaluation node;
   a pair of switch transistors corresponding to the pair of resistors on a one-to-one basis, wherein each switch transistor is coupled between the second terminal of the corresponding resistor and the corresponding evaluation node, and wherein each switch transistor is configured to switch on during a reset phase and to switch off during the evaluation phase; and
   a selection switch configured to couple the current source to the second terminal of a selected one of the resistors to produce an ohmic voltage drop at the second terminal of the selected one of the resistors.

2. The voltage-mode sense amplifier of claim 1, further comprising a pair of cross-coupled inverters configured to latch a binary state for an output data signal responsive to a voltage difference between the pair of evaluation nodes during the evaluation phase.

3. The voltage-mode sense amplifier of claim 1, wherein a first one of the evaluation nodes is a drain for a first transistor in the differential pair of transistors, and wherein a second one of the evaluation nodes is a drain for a remaining second transistor in the differential pair of transistors.

4. The voltage-mode sense amplifier of claim 1, further comprising:
   a first capacitor, wherein a drain for a first transistor in the differential pair of transistors is coupled though the first capacitor to a first one of the evaluation nodes; and
   a second capacitor, wherein a drain for a remaining second transistor in the differential pair of transistors is coupled though the second capacitor to a remaining second one of the evaluation nodes.

5. The voltage-mode sense amplifier of claim 1, wherein the current source is a current digital-to-analog-converter.

6. The voltage-mode sense amplifier of claim 1, wherein the differential pair of transistors is an n-type metal oxide semiconductor (NMOS) differential pair of transistors.

7. The voltage-mode sense amplifier of claim 2, further comprising;
   a first n-type metal oxide semiconductor (NMOS) transistor coupled between ground and an output of a first one of the cross-coupled inverters, wherein a first evaluation node in the pair of evaluation nodes is coupled to a gate of the first NMOS transistor; and
   a second NMOS transistor coupled between ground and an output of a second one of the cross-coupled inverters, wherein a second evaluation node in the pair of evaluation nodes is coupled to a gate of the second NMOS transistor.

8. The voltage-mode sense amplifier of claim 7, further comprising
   at least one power switch configured between a power supply node and a power supply input node for each of the cross-coupled inverters, wherein the at least one power switch is configured to switch off during the reset phase and to switch on during the evaluation phase.

9. The voltage-mode sense amplifier of claim 1, further comprising:
   a first n-type metal oxide semiconductor (NMOS) transistor having a source connected to ground and a drain connected to a first transistor in the differential pair of transistors, wherein the first NMOS transistor is configured to switch on during the evaluation phase and to switch off during the reset phase; and
   a second NMOS transistor having a source connected to ground and a drain connected to a second transistor in the differential pair of transistors, wherein the second NMOS transistor is also configured to switch on during the evaluation phase and to switch off during the reset phase.

10. The voltage-mode sense amplifier of claim 9, wherein the switch transistors are p-type metal oxide (PMOS) transistors, and wherein a clock signal is configured to drive a gate for the first NMOS transistor, the second NMOS transistor, and for each of the switch transistors.

11. A method of evaluating a differential data input signal in a voltage-mode sense amplifier, comprising:
   during a reset phase, charging a first evaluation node to a power supply voltage while charging a second evaluation node to the power supply voltage minus an ohmic voltage drop resulting from a current conducted through a resistor;
   during an evaluation phase following the reset phase, driving a differential pair of transistors with a differential input signal to discharge either the first evaluation node or the second evaluation node faster than a remaining one of the first evaluation node and the second evaluation node to produce an evaluation phase voltage difference between the first evaluation node and the second evaluation node responsive to a binary value for the differential input signal; and
   latching an output signal responsive to the voltage difference between the first evaluation node and the second evaluation node, wherein the voltage drop resulting from the current conducted through the resistor nulls an offset for the voltage-mode sense amplifier.

12. The method of claim 11, further comprising producing the current conducted through the resistor in a current digital-to-analog converter.

13. The method of claim 12, further comprising adjusting the current produced by the current digital-to-analog converter during a calibration phase so that the voltage-mode sense amplifier does not favor one binary state over another.

14. The method of claim 12, further comprising coupling the resistor to the current digital-to-analog converter through a selection switch.

15. The method of claim 11, wherein charging the first evaluation node to the power supply voltage also charges a drain for a first differential pair transistor in the differential pair of transistors to the power supply voltage, and wherein charging the second evaluation node to the power supply voltage minus the ohmic voltage drop also charges a drain for a second differential pair transistor in the differential pair of transistors to the power supply voltage minus the ohmic voltage drop.

16. The method of claim 11, further comprising:
   charging a pair of drains for the differential pair of transistors to the power supply voltage during the reset phase.

17. A voltage-mode sense amplifier, comprising:
   a differential pair of transistors;
   a pair of evaluation nodes, wherein the differential pair of transistors are configured to discharge, during an evaluation phase, one of the evaluation node faster than a remaining one of the evaluation nodes responsive to a binary value for a differential input signal;
   a latch configured to latch a binary state for a data output signal during the evaluation phase responsive to a voltage difference between the pair of evaluation nodes; and
   means for charging a first evaluation node in the pair of evaluation nodes to a power supply voltage during a reset phase and to charge a second evaluation node in the pair of evaluation nodes to the power supply voltage minus an ohmic voltage drop during the reset phase.

18. The voltage-mode sense amplifier of claim 17, wherein the latch comprises a pair of cross-coupled inverters.

19. The voltage-mode sense amplifier of claim 17, further comprising:
   a first capacitor coupled between a gate of a first differential pair transistor in the differential pair of transistors and a drain of a second differential pair transistor in the differential pair of transistors; and
   a second capacitor coupled between a gate of the second differential pair transistor and a drain of the first differential pair transistor.

20. The voltage-mode sense amplifier of claim 17, wherein the differential pair of transistors is a differential pair of NMOS transistors.

* * * * *